(12) United States Patent
Matteson

(10) Patent No.: US 7,006,353 B2
(45) Date of Patent: Feb. 28, 2006

(54) APPARATUS AND METHOD FOR ATTACHING A HEAT SINK TO AN INTEGRATED CIRCUIT MODULE

(75) Inventor: Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 10/798,051

(22) Filed: Mar. 11, 2004

(65) Prior Publication Data

US 2005/0201062 A1  Sep. 15, 2005

(51) Int. Cl.
*H05K 7/20* (2006.01)
(52) U.S. Cl. ............... 361/704; 361/719; 257/706; 257/712; 174/16.3; 165/80.3; 165/185
(58) Field of Classification Search ............... 361/704, 361/707, 719, 760; 257/706, 712; 174/16.3, 174/52.4; 165/80.3, 185
See application file for complete search history.

(56) References Cited

U.S. PATENT DOCUMENTS

| | | | |
|---|---|---|---|
| 4,005,457 A | 1/1977 | Hill et al. | |
| 5,359,768 A | 11/1994 | Haley | |
| 5,907,474 A * | 5/1999 | Dolbear | 361/705 |
| 6,114,761 A * | 9/2000 | Mertol et al. | 257/722 |
| 6,281,573 B1 * | 8/2001 | Atwood et al. | 257/706 |
| 6,347,037 B1 * | 2/2002 | Iijima et al. | 361/704 |
| 6,351,032 B1 * | 2/2002 | Lee et al. | 257/706 |
| 6,407,334 B1 * | 6/2002 | Jimarez et al. | 174/52.4 |
| 6,409,859 B1 | 6/2002 | Chung | |
| 6,552,266 B1 * | 4/2003 | Carden et al. | 174/52.4 |
| 6,752,204 B1 * | 6/2004 | Dishongh et al. | 165/185 |
| 6,774,306 B1 * | 8/2004 | Smith | 174/52.2 |

\* cited by examiner

*Primary Examiner*—Boris Chérvinsky
(74) *Attorney, Agent, or Firm*—Ronald V. Davidge

(57) ABSTRACT

A heat sink is fastened to an annular portion of a substrate of an integrated circuit module on a printed circuit card by means of a cured layer of cure shrinkable adhesive. A circuit chip is soldered to a central portion of the substrate, around which the annular portion extends. A layer of thermally conductive material is placed between the circuit chip and a central portion of the heat sink, to be compressed as the layer of cure shrinkable adhesive is cured. A compression limiting structure may additionally extend between the heat sink and the annular portion of the substrate, limiting the shrinkage of the adhesive and thus the compression of the thermally conductive material and the flexure of the substrate.

36 Claims, 2 Drawing Sheets

APPARATUS AND METHOD FOR ATTACHING A HEAT SINK TO AN INTEGRATED CIRCUIT MODULE

BACKGROUND OF THE INVENTION

1. Field of the Invention

This invention relates to the manufacture of integrated circuit modules and of circuit boards including integrated circuit modules, and, more particularly, to the attachment of heat sinks to integrated circuit modules within circuit board assemblies.

2. Summary of the Background Art

Due to decreases in the size of circuit elements, such as transistors within integrated circuit modules, and additionally due to increases in the clock frequencies used within computing systems, integrated circuits are being built in smaller sizes with increased levels of capability, often resulting in increased levels of heat generation. This statement is particularly true for the chips supporting controllers in personal computer. Such support chips are now being designed to dissipate significantly more power than similar devices from previous generations of circuits. Additionally, more powerful support chips are being designed without integrated heat spreaders (IHSs), which have conventionally been used to achieve effective cooling.

One traditional method for cooling a large circuit chip, such as an ASIC having a suitably large surface area has been to fasten a heat sink to the surface with epoxy. However, as the circuit chips grow smaller, and as the heat sinks required to dissipate increasing levels of power grow larger, the fragility of the silicon structure to which the heat sink is bonded becomes a significant problem. In particular, a massive heat sink can cause cracking of the silicon due to mechanical shock and vibration. Thus, what is needed is a method providing for the efficient transfer of heat from a circuit chip without requiring the attachment of a heat sink directly to the circuit chip.

Another traditional method, which has been used extensively to provide cooling for circuit chips, is to hold a heat sink against the surface of a circuit chip by means of an external spring clip. However, the use of an external spring clip typically requires the existence of significant clip mounting space outside the footprint of the circuit chip. Such space is becoming increasingly difficult to provide, as it is becoming necessary to provide increased levels of function in smaller sections of a circuit board.

A method for cooling a very small integrated circuit package, and for mounting the package on a circuit board, is described in U.S. Pat. No. 5,359,768. According to this method, the circuit package includes a circuit chip or die that is attached to the heat sink using an adhesive before the die is attached to the circuit board. The die includes solder bumps facing the circuit board for direct attachment to contacts on the surface of the circuit board. Since the heat sink is attached to the die before the die is attached to the circuit board, the heat sink may be used to facilitate handling the smaller substrate during the manufacturing and testing processes. In one embodiment, the solder connection between the circuit board and the die is made by heating the chip to reflow the solder. In another embodiment, the connection is made by using a shrinking adhesive placed to extend around the die and between the heat sink and the circuit board. Again, what is needed is a method providing for the efficient transfer of heat from the circuit chip or die without attaching a heat sink directly to the die, so that damage to the silicon material of the die due to shock and vibration can be prevented.

U.S. Pat. No. 6,409,859 describes an electronic package or module protected by a lid sealed with a thermoplastic or thermosetting laminate that has been previously applied onto the lid, including the bonding area of the lid. The adhesive is deposited as wet adhesive or is laminated in sheet format onto a sheet of the material of which the lids are to be formed. The adhesive is dried or B-staged to become a solid sheet perform, as by solvent removal or chemical cross-linking, respectively. Again, what is needed is a method providing for efficient heat transfer without the attachment of a heat dissipating structure directly to the circuit chips.

U.S. Pat. No. 4,005,457 describes a semiconductor assembly devoid of wire bonds, comprising a semiconductor, an electrode-containing substrate supporting the semiconductor, and an electrode containing substrate supported by the semiconductor. A cure-shrinkable adhesive means incorporating an oxide remover (preferably a halogen) physically bonds together the semiconductor and the cover electrode. This assembly method is applied particularly to semiconductor chips forming light emitting diodes.

SUMMARY OF THE INVENTION

In accordance with an aspect of the invention, a circuit board assembly is provided, with the circuit board assembly including a circuit board, a substrate, a circuit chip, a heat sink, a layer of thermally conductive material, and a cured layer of cure shrinkable adhesive. The circuit board includes a number of conductive circuit traces extending from a number of contact surfaces. The substrate includes a number of contact terminals, individually connected to the contact surfaces of the circuit board by solidifying molten solder, an outer surface facing away from the circuit board, and a number of contact surfaces, extending along the outer surface of the substrate, electrically connected within the substrate to the number of contact terminals of the substrate. The circuit chip extends adjacent a central portion of the outer surface of the substrate, which is surrounded by an annular portion of the outer surface of the substrate. The circuit chip has a number of contact terminals, individually connected to the contact surfaces of the substrate by solidifying molten solder, and an external surface. The heat sink extends outwardly from the circuit chip and the substrate. The heat sink includes an inner surface having a central portion extending adjacent the outer surface of the circuit chip and an annular portion extending outward from the central portion. The layer of thermally conductive material extends between the external surface of the circuit chip and the central portion of the inner surface of the heat sink. The cured layer of cure shrinkable adhesive extends between the annular portion of the outer surface of the substrate and the annular portion of the inner surface of the heat sink to hold the heat sink in place over the substrate and to hold the layer of thermally conductive material in compression.

The circuit board assembly may also include a compression limiting structure, limiting the shrinkage of the shrink curable adhesive during the curing process to limit the resulting compression of the thermally conductive material and to limit flexure of the substrate. The compression limiting structure extends between the annular portion of the outer surface of the substrate and the annular portion of the inner surface of the heat sink, extending outward from the substrate or inward from the heat sink.

In accordance with another aspect of the invention, a method is provided for attaching a heat sink to a substrate having an annular outer surface extending around a circuit chip fastened to the substrate and extending outward from the annular outer surface of the substrate. The method includes steps of:

applying a layer of thermally conductive material to a central portion of an inner surface of the heat sink;

applying a layer of cure shrinkable adhesive to an annular portion of the inner surface of the heat sink, with the annular portion extending around the central portion of this surface;

placing the heat sink on the substrate with the thermally conductive material extending along an outer surface of the circuit chip, and with the layer of cure shrinkable adhesive extending along the annular portion of the outer surface of the substrate; and curing the adhesive.

DETAILED DESCRIPTION OF THE INVENTION

Figures 1, 2, 3, 4:
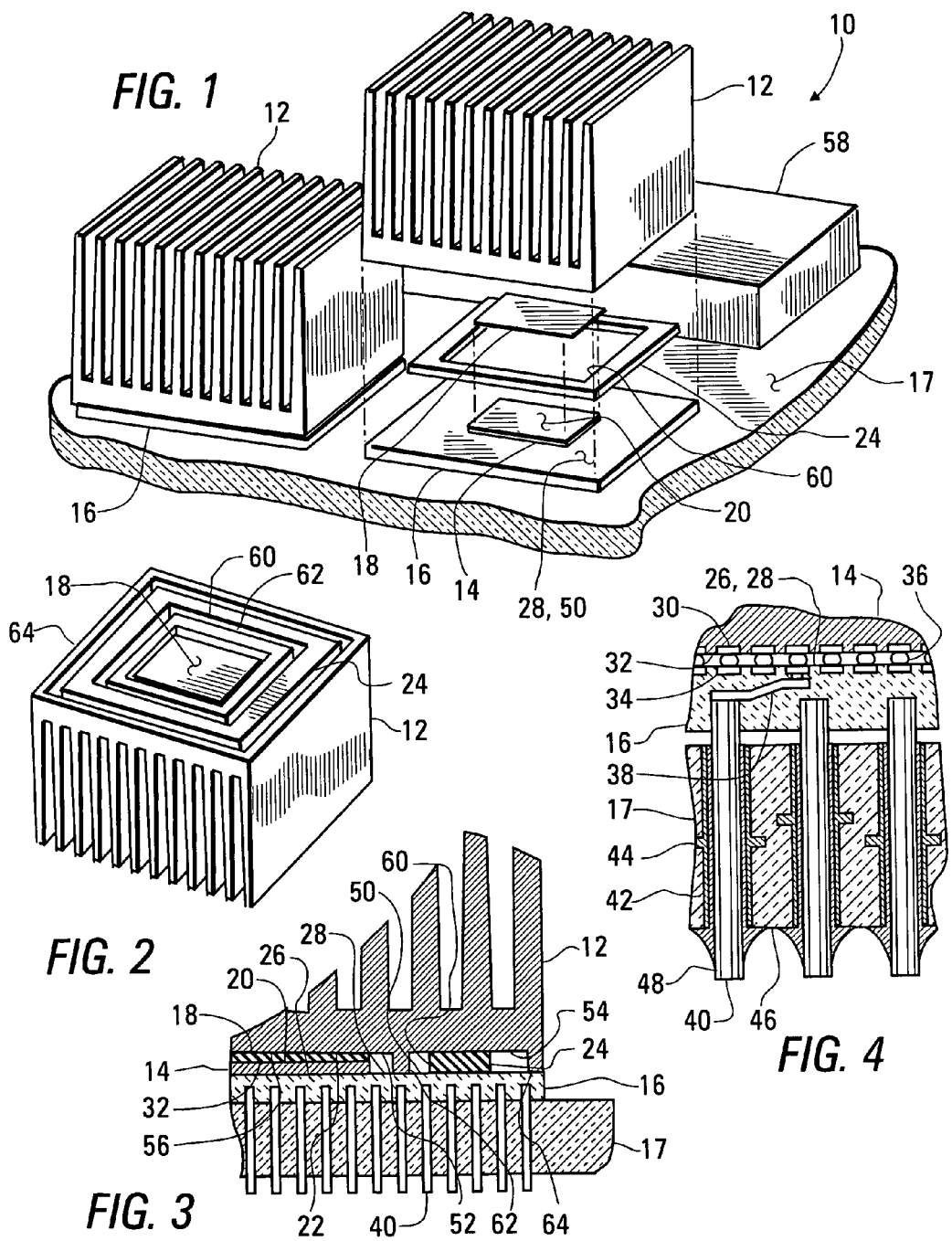
FIG. 1 is a fragmentary perspective view of a circuit board assembly built in accordance with a first version of the invention, including a heat sink shown in an exploded relationship with other elements of the circuit board assembly.
FIG. 2 is a perspective view of a heat sink in an inverted orientation, as prepared for attachment within the circuit board assembly of FIG. 1.
FIG. 3 is a fragmentary vertical cross-sectional view of the circuit board assembly of FIG. 1. showing an area of attachment between a heat sink and a substrate therein.
FIG. 4 is a fragmentary vertical cross-sectional view of the circuit board assembly of FIG. 1, showing electrical connections therein.

A first version of the invention will now be discussed, with reference being made to FIGS. 1–3. FIG. 1 is a fragmentary perspective view of a circuit board assembly 10 built in accordance with a first version of the invention, including a number of heat sinks 12 attached to extend over a number of circuit chips 14 and associated substrates 16, which are in turn attached to a circuit board 17. A circuit chip 14 and an associated substrate 16 together form an integrated circuit module. One of the heat sinks 12 is shown in an exploded relationship with other elements of the circuit board assembly 10. FIG. 2 is a perspective view of a heat sink 12 in an inverted orientation, shown as prepared for attachment within the circuit board assembly 10. FIG. 3 is a fragmentary vertical cross-sectional view of the circuit board assembly 10, showing the attachment of a heat sink 12 to a substrate 16.

Thermal conduction between each of the circuit chips 14 and an associated heat sink 12 is established through a layer of thermally conductive material 18, which is disposed between an outer surface 20 of the circuit chip 14 and an inner surface 22 of the heat sink 12. The heat sink 12 is attached to the substrate 16 by mean s of a cured layer of cure shrinkable adhesive 24.

FIG. 4 is a fragmentary vertical cross-sectional view of the circuit board assembly 10, showing electrical connections between the circuit chip 14 and the substrate 16 and additionally between the substrate 16 and the circuit board 17. The circuit chip is fastened to a central portion 26 of the outer surface 28 of substrate 16, with a number of contact terminals 30 extending along an inner surface 32 of the circuit chip 14 being connected to a number of contact surfaces 34 extending along the central portion 26 by melting and solidifying solder balls 36 between the individual contact terminals 30 and corresponding contact surfaces 34. Within the substrate 16, conductive elements 38 establish an electrical path between each of the contact surfaces 34 and a corresponding pin 40 serving as a contact terminal for making an electrical connection between the substrate 16 and the circuit board 17. While only one such electrical path is shown, it is understood that each of the contact surfaces 34 is preferably connected to a corresponding pin 40 by a separate electrical path through the substrate 16.

Preferably, the electrical connections between the circuit chip 14 and the substrate 16 are completed during an electronic module manufacturing process, with a completed subassembly including the circuit chip 14 and the substrate 16, including the pins 40, then being supplied to a circuit board manufacturing process. The circuit board 17 is additionally supplied to this manufacturing process with a number of plated through holes 42 located in positions corresponding to the pins 40, and with the plated surface of each of the plated through holes 42 being electrically connected to a conductive circuit trace 44 extending within the circuit board 17 from the hole 42. In this circuit board manufacturing process, molten solder, for example, in the form of a wave driven along the surface 46 of the circuit board 17, flows around the tip 48 of each pin 40 and into a space between the pin and the corresponding plated through hole 42. This molten solder then solidifies, forming an electrical and mechanical connection between the pin 40 and the plated surface of the plated through hole 42. Thus, each of the pins 40 forms a contact terminal of the substrate 16, while each of the plated surfaces of a plated through hole 42 forms a contact surface of the circuit board 17.

Referring additionally again to FIGS. 1–3, since the connections made between the pins 40 and the plated through holes 42 require substantially more space than the corresponding connections between the contact terminals 30 of the circuit chip 14 and the contact surfaces 34 of the substrate 16, the substrate 16 extends along the circuit card 17 past the circuit chip 14. In this way, the outer surface 28 of the substrate 16 is provided with an annular portion 50 extending around the central portion 26, which extends adjacent the circuit chip 14. The heat sink 12 is preferably configured to occupy the same space on the circuit board 17 as the substrate 16, so that the space available for heat dissipation is maximized without requiring the use of additional space on the circuit board 17. Thus, the inner surface 52 of the heat sink 12 is provided with an annular portion 54, extending around a central portion 56 on which the layer of thermally conductive material 18 is placed to transfer heat from the circuit chip 14. The cured layer of cure shrinkable adhesive 24 extends around the circuit chip 14, between the annular portion 50 of the outer surface 28 of the substrate 16 and the annular portion 54 of the inner surface 52 of the heat sink 12.

Alternately, the substrate 16 may be attached to the circuit board 17 by other means, well known to those skilled in the art of circuit board assembly design and manufacture. For example solder attachment to pads on the surface of the circuit board 17 may be made through melting a second array of solder balls.

The circuit board assembly 10 preferably includes a number of other components 58. For example, the circuit board assembly 10 includes a controller circuit module and a number of support modules including circuit chips 14 and substrates 16. These various elements are connected to the circuit board 17 by solder attachment during the circuit board manufacturing process. Then, a process for attaching the heat sinks 12 is begun by placing the layers of thermally conductive material 18 and the layers of heat curable adhesive 24 in place on the inner surfaces 52 of the heat sinks 12, as shown in FIG. 2. Next, the heat sinks 12 are placed over the substrates 16, and the layers of cure shrinkable adhesive 24 are cured, in a process causing the adhesive layers 24 to shrink, moving the heat sinks 12 closer to the adjacent circuit chips 14, so that each layer of thermally conductive material 18 is compressed, causing a condition that is particularly desirable for promoting the efficient transmission of heat from the circuit chip 14 to the heat sink 12.

In the example of FIGS. 1–3, the layer of cure shrinkable adhesive 24 is formed as a rectangle having an aperture 60 through which the circuit chip 14 and the layer of thermally conductive material 18 extend. Furthermore, the outer surface 28 of the substrate 16 is flat, while the annular portion 54 of the inner surface 52 of the heat sink 12 is provided with a first ridge 62, disposed within the aperture 56 and a second ridge 64 disposed outside the layer of cure shrinkable adhesive 24. Both of these ridges 62, 64, form a compression limiting structure extending between the annular portion 54 of the inner surface 52 of the heat sink 12 and the annular portion 50 of the substrate 16 to limit the shrinkage that can occur within the cure shrinkable layer 24 during the curing process, and hence to limit the resulting compression of the thermally conductive layer 18. Additionally, this compression limiting structure limits flexure of the substrate 16 as a reaction to stresses imposed by shrinking the cure shrinkable layer 24. In an alternative substrate fastened to the circuit board 17 by additionally solder balls, such flexure could otherwise cause cracking of the attachments.

Variations in the form of the compression limiting structure will now be discussed, with particular reference being made to FIGS. 5–10.

Figure 5:
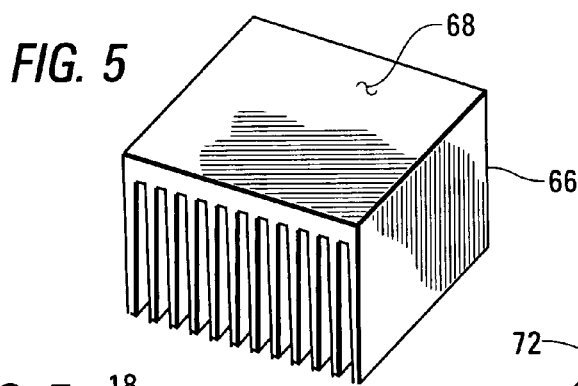
FIG. 5 is a perspective view of a first alternative version of a heat sink in an inverted orientation, which may be attached to a substrate in the circuit board assembly of FIG. 1.
Figure 6:
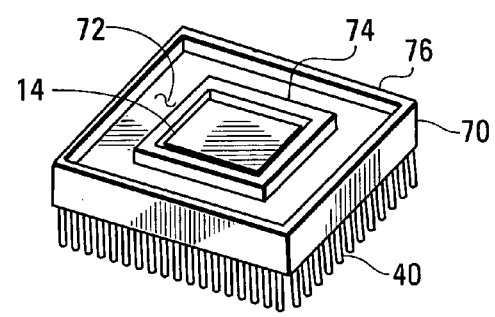
FIG. 6 is a perspective view of a first alternative version of a substrate, to which the heat sink of FIG. 5 may be attached.

Referring first to FIGS. 5 and 6, a first alternative heat sink 66, which is shown in an inverted orientation, is provided with a flat inner surface 68, for use with a first alternative substrate 70, having an outer surface 72 with a compression limiting structure including a first ridge 74 and a second ridge 76. The circuit chip 14 is attached to a central portion of the outer surface 72 of the first alternative substrate 70 as described above in reference to FIG. 4. Before the heat sink 66 is attached to the substrate 70, the substrate 70 is attached to a circuit board, additionally as described in reference to FIG. 4, with the pins 40 being attached by solder to contact surfaces within the circuit board. Then, the layer of thermally conductive material 18, and the layer of cure shrinkable adhesive 24 (shown in FIG. 1) are placed on the flat surface 68, being located so that the layer of thermally conductive material 18 extends within the first ridge 74 and so that the layer of cure shrinkable adhesive 24 extends between the first ridge 74 and the second ridge 76 when the heat sink 66 is subsequently placed on the substrate 70. After the heat sink 66 is then placed on the substrate 70, the layer of cure shrinkable adhesive 24 is cured, shrinking to bring the flat surface 68 of the heat sink 66 into contact with the ridges 74, 76 of the substrate 70.

While FIGS. 2 and 3 show a pair of ridges 62, 64 extending along the inner surface 22 of the heat sink 12, and while FIG. 6 similarly shows a pair of ridges 74, 76 extending along the outer surface 72 of the first alternative substrate 70, it is understood that either of the ridges in either of these pairs of ridges could be used alone to provide the function of a compression limiting structure.

Figure 7:
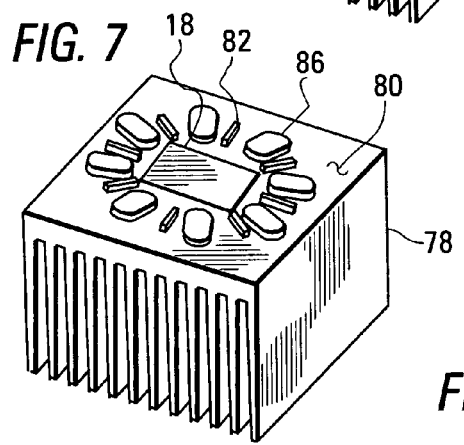
FIG. 7 is a perspective view of a second alternative version of a heat sink in an inverted orientation, shown as prepared for attachment to a substrate in the circuit board assembly of FIG. 1.

Referring to FIG. 7, a second alternative heat sink 78, which is also shown in an inverted orientation, includes an inner surface 80 provided with a compression limiting structure in the form of a number of ridges 82 extending radially outside a central portion of the inner surface 80, to which the layer of thermally conductive material 18 is applied. A number of spaced apart pads 86 of cure shrinkable adhesive, which are located among the ridges 82, are applied to an annular portion of the inner surface 80, before the second alternative heat sink 78 is placed on the outer surface 28 of the substrate 16 (shown in FIG. 1).

Figure 8:
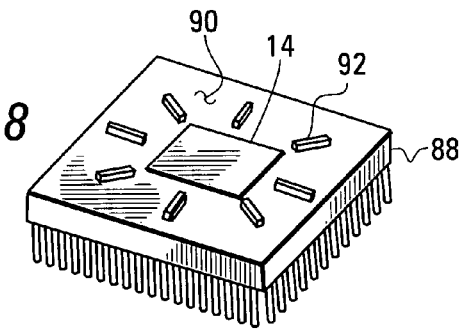
FIG. 8 is a perspective view of a second alternative version of a substrate, to which the heat sink of FIG. 5 may be attached.

Referring to FIG. 8, a second alternative substrate 88 has an outer surface 90 provided with a compression limiting structure in the form of a number of ridges 92 extending radially outside the circuit chip 14. The second alternative substrate 88 is attached to a circuit board, as described in reference to FIG. 4, and the layer of thermally conductive material 18 is applied, together with a pattern of spaced apart pads 86 of cure shrinkable adhesive (as shown in FIG. 7) to the inner surface 68 of the first alternative heat sink 66. Then, the heat sink 66 is placed on the substrate 88, and the pads 86 are cured. Preferably, the pads 86 are located on the heat sink 66 so that they are individually disposed between the ridges 92.

Figure 9:
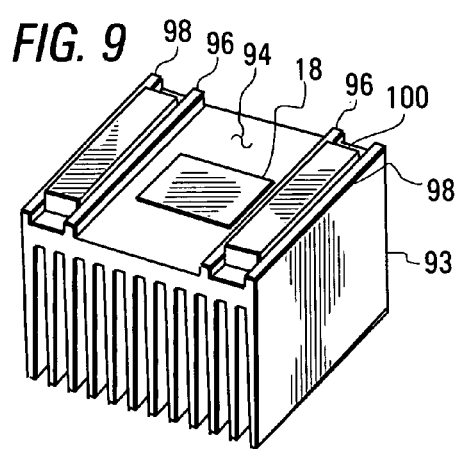
FIG. 9 is a perspective view of a third alternative version of a heat sink in an inverted orientation, shown as prepared for attachment to a substrate in the circuit board assembly of FIG. 1.

Referring to FIG. 9, a third alternative heat sink 93 includes an inner surface 94 provided with an inner pair of ridges 96 and an outer pair of ridges 98. The heat sink 92 is prepared for attachment to the substrate 16 (shown in FIG. 1) by placing a rectangular layer of cure shrinkable adhesive 100 between a ridge 96 and a ridge 98 at each end of the inner layer 94, and by applying the layer of thermally conductive material 18 to the central portion of the inner surface 94, between the inner ridges 96. After the heat sink 93 is placed on the substrate 16, the material of adhesive layers 100 is cured, attaching the heat sink 93 to the substrate 18 and compressing the layer of thermally conductive material 16 between the circuit chip 14 and the heat sink 93.

Figure 10:
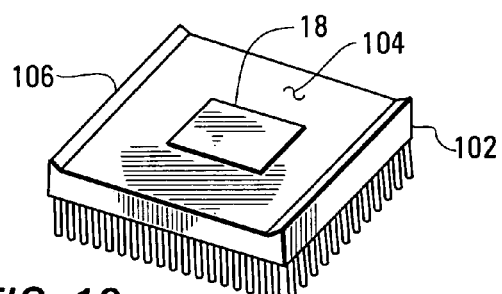
FIG. 10 is a perspective view of a third alternative version of a substrate, to which the heat sink of FIG. 5 may be attached.

Referring to FIG. 10, a third alternative substrate 102 has an outer surface 104 provided with a pair of ridges 106. This substrate 102 is attached to a circuit board, as described in reference to FIG. 4, and the rectangular layers of cure shrinkable adhesive 100 (shown in FIG. 7) are applied to the inner surface 68 of the first alternative heat sink 66 so they are disposed on the surface 104 adjacent the ridges 106 when the heat sink 66 is subsequently placed on the substrate 102.

While the preceding discussion has described compression limiting structures of various types, being provided either to the outer surface of a substrate or to the inner surface of a heat sink, it is understood that shrinkage characteristics of the heat shrinkable adhesive may alternately be relied upon to establish an appropriate level of compression within the thermally conductive material 18. For example, referring to FIGS. 1 and 5, the layer of cure shrinkable adhesive 24 may be applied, together with the layer of thermally conductive material 18 to the inner surface 68 of the first alternative heat sink 66, with the heat sink 66 then being placed on the substrate 16. As the layer of cure shrinkable adhesive 24 is then cured, its shrinkage compresses the thermally conductive material 18 between the circuit chip 14 and the heat sink 66 without encountering a compression limiting structure.

The layer of cure shrinkable adhesive 24, 86, 100 preferably shrinks, for example, three to five percent during the curing process. An example of such a material is sold by the 3M Company under the name SCOTCH-WELD® DP100 epoxy adhesive. Alternatively, the cure shrinkable adhesive may be a tape including a cure shrinkable adhesive, such as 3M SBT Structural Bonding Tape. If the cure shrinkable adhesive is introduced as a liquid, it may be deposited in the desired shapes by controlling the movement of a nozzle through which it is deposited, or by depositing it through holes in a mask or screen. If the cure shrinkable adhesive is introduced as a tape, it may be die cut into the desired shapes before application.

The layer of thermally conductive material 18 is, for example, a phase change material, such as Chomerics T-710, Honeywell PCM45, Thermoset Lord TC-330, Dow Corning PCM 260, or Berquist 225U. Alternately, the thermally conductive material 18 may include a grease, such as Shin-Etsu G751 or Shin-Etsu 7783D.

While the invention has been described in its preferred versions with some degree of particularity, it is understood that this description has been given only by way of example, and that many variations can be made without departing from the spirit and scope of the invention, as defined in the appended claims.

What is claimed is:

1. A circuit board assembly comprising:
   a circuit board including a plurality of conductive circuit traces extending from a plurality of contact surfaces;
   a substrate having a plurality of contact terminals, individually connected to the contact surfaces of the circuit board by solidifying molten solder, an outer surface facing away from the circuit board, including a central portion and an annular portion extending around the central portion, and a plurality of contact surfaces, extending along the central portion of the outer surface of the substrate, electrically connected within the substrate to the plurality of contact terminals of the substrate;
   a circuit chip extending adjacent the central portion of the outer surface of the substrate, wherein the circuit chip has a plurality of contact terminals, individually connected to the contact surfaces of the substrate by solidifying molten solder, and an outer surface;
   a heat sink extending outwardly from the circuit chip and the substrate, wherein the heat sink includes an inner surface having a central portion extending adjacent the outer surface of the circuit chip and an annular portion extending outward from the central portion;
   a layer of thermally conductive material extending between the external surface of the circuit chip and the central portion of the inner surface of the heat sink; and
   a cured layer of cure shrinkable adhesive extending between the annular portion of the outer surface of the substrate and the annular portion of the inner surface of the heat sink to hold the heat sink in place over the substrate and to hold the layer of thermally conductive material in compression.

2. The circuit board assembly of claim 1, additionally comprising a compression limiting structure extending between the annular portion of the outer surface of the substrate and the annular portion of the inner surface of the heat sink to limit the compression applied to the layer of thermally conductive material by the cured layer of cure shrinkable adhesive.

3. The circuit board assembly of claim 2, wherein
   the outer surface of the substrate is flat, and
   the compression limiting structure extends inward as a portion of the heat sink to contact the outer surface of the substrate.

4. The circuit board assembly of claim 2, wherein
   the inner surface of the heat sink is flat, and
   the compression limiting structure extends outward as a portion of the substrate to contact the inner surface of the heat sink.

5. The circuit board assembly of claim 2, wherein
   the cured layer of cure shrinkable adhesive is shaped as a rectangle having a rectangular aperture,
   the circuit chip is disposed within the rectangular aperture, and
   the compression limiting structure includes a ridge extending around the cured layer of cure shrinkable adhesive.

6. The circuit board assembly of claim 2, wherein
   the cured layer of cure shrinkable adhesive is shaped as a rectangle having a rectangular aperture,
   the compression limiting structure includes a ridge extending within the rectangular aperture of the cured layer of cure shrinkable adhesive, and
   the circuit chip disposed within the ridge extending within the rectangular aperture of the cured layer of cure shrinkable adhesive.

7. The circuit board assembly of claim 2, wherein
   the cured layer of cure shrinkable adhesive is divided into a plurality of spaced apart pads extending around the circuit chip, and
   the compression limiting structure includes a plurality of ridges extending radially outward between adjacent pads in the plurality of spaced apart pads.

8. The circuit board assembly of claim 2, wherein
   the cured layer of cure shrinkable adhesive is divided into a pair of rectangular pads extending along adjacent opposite ends of the heat sink, and
   the compression limiting structure includes a ridge extending adjacent each of the rectangular pads.

9. The circuit board assembly of claim 1, wherein
   the outer surface of the substrate and the inner surface of the heat sink are both flat,
   the cured layer of cure shrinkable adhesive is shaped as a rectangle having a rectangular aperture, and
   the circuit chip is disposed within the rectangular aperture.

10. The circuit board assembly of claim 1, wherein
    the outer surface of the substrate and the inner surface of the heat sink are both flat, and the cured layer of cure shrinkable adhesive is divided into a plurality of spaced apart pads extending around the circuit chip.

11. The circuit board assembly of claim 1, wherein
the outer surface of the substrate and the inner surface of the heat sink are both flat, and
the cured layer of cure shrinkable adhesive is divided into a pair of rectangular pads extending along adjacent opposite ends of the heat sink.

12. A heat sink for attachment to a substrate including a flat annular outer surface extending around a circuit chip, wherein the heat sink has an inner surface comprising:
a flat central portion for application of a layer of thermally conductive material,
a flat annular portion extending around the flat central portion of the inner surface of the heat sink for application of a cured layer of cure shrinkable material, and
a compression limiting structure extending inward from the flat annular portion for limiting compression of the thermally conductive material during curing of the cure shrinkable material.

13. The heat sink of claim 12, wherein the compression limiting structure includes a ridge extending around an inner edge of the flat annular portion of the inner surface of the heat sink.

14. The heat sink of claim 12, wherein the compression limiting structure includes a ridge extending around an outer edge of the flat annular portion of the inner surface of the heat sink.

15. The heat sink of claim 12, wherein the compression limiting structure includes a plurality of ridges extending radially along the flat annular portion of the inner surface of the heat sink.

16. The heat sink of claim 12, wherein the compression limiting structure includes a pair of parallel ridges extending along opposite sides of the flat central portion of the inner surface of the heat sink.

17. A substrate for attachment to a circuit chip, to a circuit board, and to a heat sink, including a flat annular inner surface extending around the circuit chip, wherein the substrate comprises:
an inner surface;
a plurality of contact terminals for connection to contact surfaces of a circuit board extending adjacent the inner surface of the substrate; and
an outer surface including a central portion having a plurality of contact surfaces for attachment to contact terminals of a circuit chip, wherein the contact surfaces of the outer surface of the substrate are individually electrically connected to contact terminals within the plurality of contact terminals, a flat annular portion extending around the central portion of the outer surface of the substrate for attachment to a cure shrinkable adhesive, and a compression limiting structure extending outward from the flat annular portion for limiting shrinkage of the cure shrinkable adhesive during curing.

18. The substrate of claim 17, wherein the compression limiting structure includes a ridge extending around an inner edge of the flat annular portion of the outer surface of the substrate.

19. The substrate of claim 17, wherein the compression limiting structure includes a ridge extending around an outer edge of the flat annular portion of the outer surface of the substrate.

20. The substrate of claim 17, wherein the compression limiting structure includes a plurality of ridges extending radially along the flat annular portion of the outer surface of the substrate.

21. A circuit board assembly comprising:
a circuit board including a plurality of conductive circuit traces extending from a plurality of contact surfaces;
a plurality of substrates, wherein each substrate within the plurality of substrates has a plurality of contact terminals, individually connected to the contact surfaces of the circuit board by solidifying molten solder, an outer surface facing away from the circuit board, and a plurality of contact surfaces, extending along the outer surface of the substrate, individually electrically connected within the substrate to the plurality of contact terminals of the substrate;
a circuit chip extending adjacent a central portion of the outer surface of each substrate within the plurality of substrates, wherein the central portion of the outer surface of the substrate is surrounded by an annular portion of the outer surface of the substrate, wherein the circuit chip has a plurality of contact terminals, individually connected to the contact surfaces of the substrate by solidifying molten solder, and an external surface;
a heat sink extending outwardly from the circuit chip and from each substrate within the plurality of substrates, wherein the heat sink includes an inner surface having a central portion extending adjacent the outer surface of the circuit chip and an annular portion extending outward from the central portion;
a layer of thermally conductive material extending between the external surface of the circuit chip and the central portion of the inner surface of the heat sink; and
a cured layer of cure shrinkable adhesive extending between the annular portion of the outer surface of the substrate and the annular portion of the inner surface of the heat sink to hold the heat sink in place over the substrate and to hold the layer of thermally conductive material in compression.

22. The circuit board assembly of claim 21, additionally comprising a compression limiting structure extending between the annular portion of the outer surface of each substrate within the plurality of substrates and the annular portion of the inner surface of the heat sink attached to the substrate to limit the compression applied to the layer of thermally conductive material by the cured layer of cure shrinkable adhesive.

23. The circuit board assembly of claim 22, wherein
the outer surface of the substrate is flat, and
the compression limiting structure extends inward as a portion of the heat sink to contact the outer surface of the substrate.

24. The circuit board assembly of claim 22, wherein
the inner surface of the heat sink is flat, and
the compression limiting structure extends outward as a portion of the substrate to contact the inner surface of the heat sink.

25. A method for attaching a heat sink to a substrate having an annular outer surface extending around a circuit chip fastened to the substrate and extending outward from the annular outer surface of the substrate, wherein the substrate is additionally attached to a circuit board, and wherein the method comprises steps of:
applying a layer of thermally conductive material to a central portion of an inner surface of the heat sink;

applying a layer of cure shrinkable adhesive to an annular portion of the inner surface of the heat sink, wherein the annular portion of the inner surface of the heat sink extends around the central portion of the inner surface of the heat sink;

placing the heat sink on the substrate with the thermally conductive material extending along an outer surface of the circuit chip, and with the cure shrinkable adhesive extending along the annular outer surface of the substrate; and curing the layer of cure shrinkable adhesive.

26. The method of claim 25, wherein the layer of cure shrinkable adhesive is shaped as a rectangle having a central rectangular aperture.

27. The method of claim 26, wherein the layer of cure shrinkable adhesive is applied to extend around a ridge extending inward from the annular portion of the inner surface of the heat sink to limit shrinkage of the cure shrinkable adhesive during curing.

28. The method of claim 26, wherein the layer of cure shrinkable adhesive is applied to extend within a ridge extending inward from the annular portion of the inner surface of the heat sink to limit shrinkage of the cure shrinkable adhesive during curing.

29. The method of claim 26, wherein the layer of cure shrinkable adhesive is applied to extend, after the heat sink is placed on the substrate, around a ridge extending outward from the annular portion of the outer surface of the substrate to limit shrinkage of the cure shrinkable adhesive during curing.

30. The method of claim 26, wherein the layer of cure shrinkable adhesive is applied to extend, after the heat sink is placed on the substrate, within a ridge extending outward from the annular portion of the outer surface of the substrate to limit shrinkage of the cure shrinkable adhesive during curing.

31. The method of claim 25, wherein the layer of cure shrinkable adhesive is applied as a plurality of spaced apart pads.

32. The method of claim 31, wherein the spaced apart pads are individually placed on the annular portion of the inner surface of the heat sink between ridges extending inward from the inner surface of the heat sink to limit shrinkage of the cure shrinkable adhesive during curing.

33. The method of claim 31, wherein the spaced apart pads are individually placed on the annular portion of the inner surface of the heat sink to extend, after the heat sink is placed on the substrate, between ridges extending outward from the outer surface of the substrate to limit shrinkage of the cure shrinkable adhesive during curing.

34. The method of claim 25, wherein the layer of cure shrinkable adhesive is applied to opposite ends of the annular portion of the inner surface of the heat sink.

35. The method of claim 34, wherein each of the rectangular pads is applied to extend adjacent a ridge extending inward from the inner surface of the heat sink to limit shrinkage of the cure shrinkable adhesive during curing.

36. The method of claim 35, wherein each of the rectangular pads is applied to extend, after the heat sink is placed on the substrate, adjacent a ridge extending outward from the outer surface of substrate to limit shrinkage of the cure shrinkable adhesive during curing.

* * * * *